United States Patent [19]

Bamji et al.

[11] Patent Number: 5,281,558

[45] Date of Patent: Jan. 25, 1994

[54] CLONING METHOD AND SYSTEM FOR HIERARCHICAL COMPACTION

[75] Inventors: Cyrus S. Bamji; Ravi Varadarajan, both of Fremont, Calif.

[73] Assignee: Cadence Design Systems, Inc., San Jose, Calif.

[21] Appl. No.: 970,640

[22] Filed: Nov. 2, 1992

[51] Int. Cl.⁵ .................... H01L 21/00; G06F 15/00
[52] U.S. Cl. .................... 437/250; 364/491
[58] Field of Search .................. 437/51, 250, 491

[56] References Cited

U.S. PATENT DOCUMENTS

| | | | |
|---|---|---|---|
| 4,882,999 | 12/1989 | Shiraishi et al. | 437/51 |
| 4,965,739 | 10/1990 | Shaw et al. | 364/491 |
| 5,124,273 | 6/1992 | Minami | 437/51 |

Primary Examiner—Tom Thomas
Attorney, Agent, or Firm—Kenneth M. Kaslow; Elizabeth F. Enayati

[57] ABSTRACT

A computer system and computer-implemented method for compacting the geometrical area of a hierarchical integrated circuit layout. The present invention is particularly adapted for use with layouts including over-the-cell routing (OTCR). The inventive method includes the general steps of normalizing the cells, compacting the cells, then reconstructing the layout that includes the normalized cells. More particularly, the step of normalizing the cells includes initial step of identifying an overlapping object produced from the OTCR that overlaps one of the instances. That overlapping object is then divided into an overlapping segment and a non-overlapping segment. The overlapping segment is then removed from the cell and copied into the leaf cell of the overlapped instance. The overlapping segment is defined as a special object of the cell into which it is copied.

12 Claims, 10 Drawing Sheets

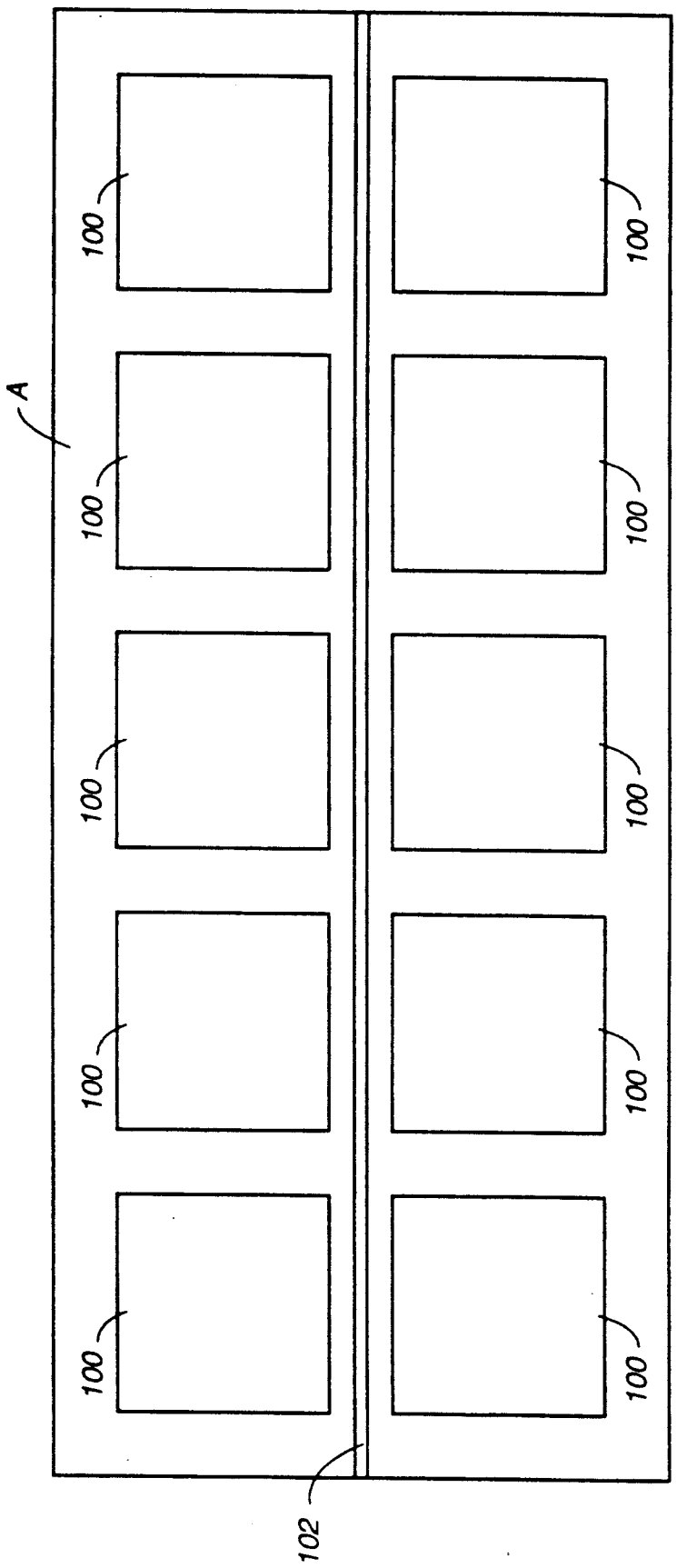
FIG._1 (PRIOR ART)

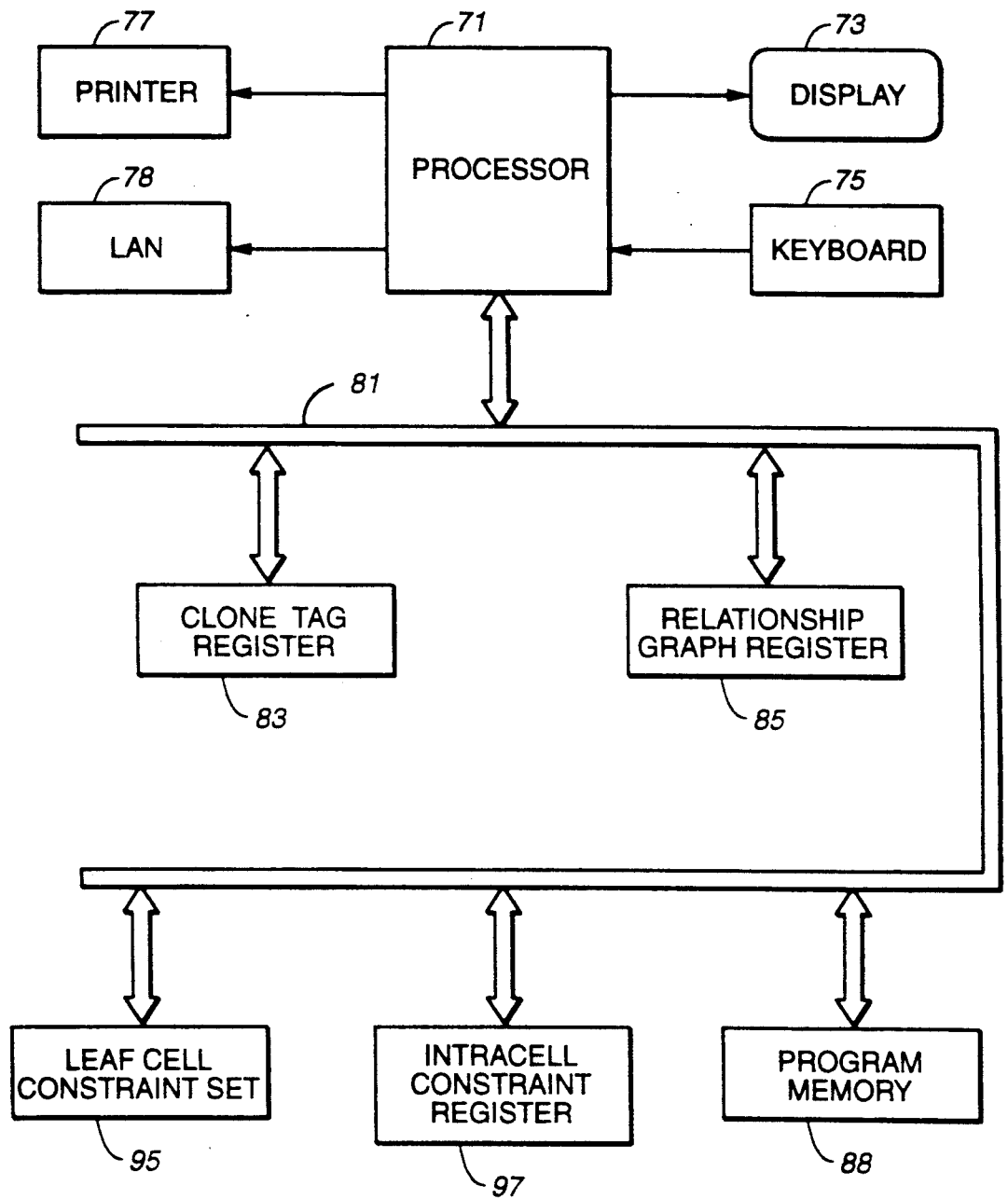
FIG._2

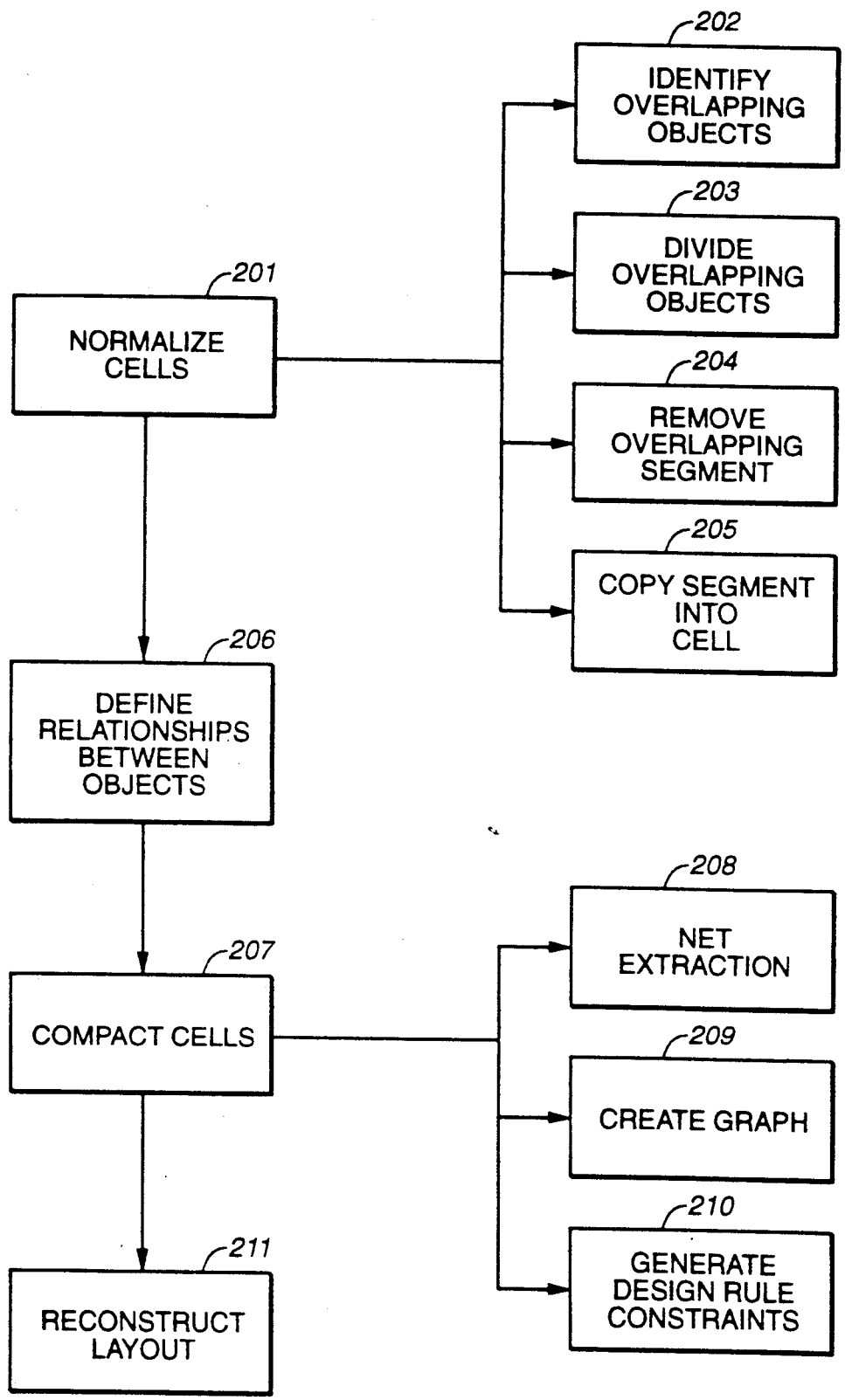
FIG._3

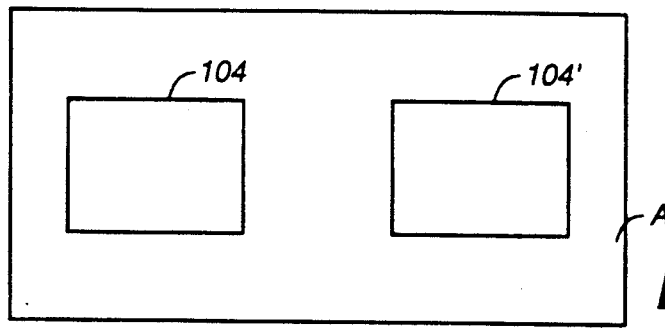
FIG._4A
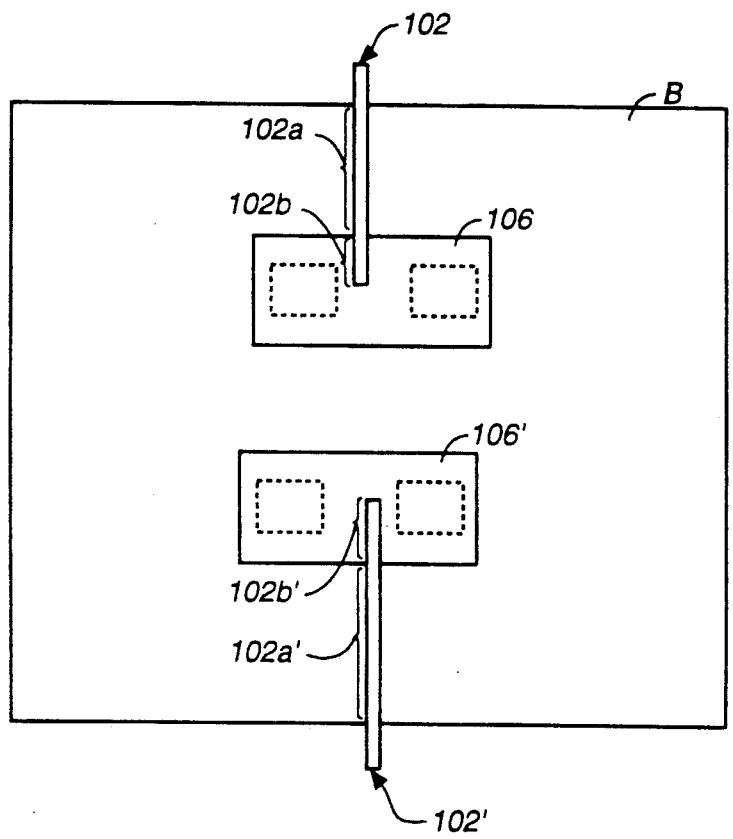
FIG._4B
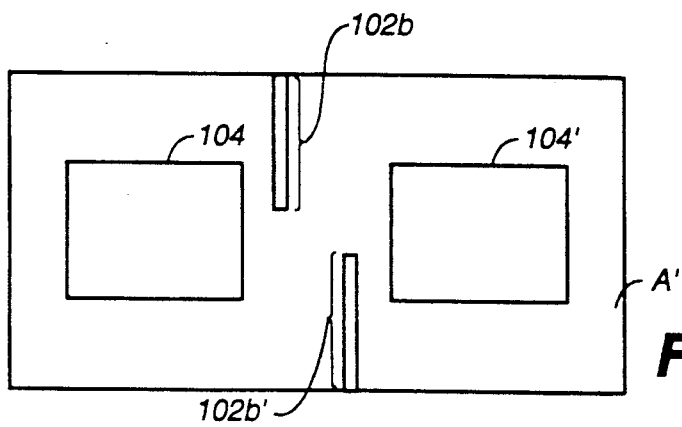
FIG._4C

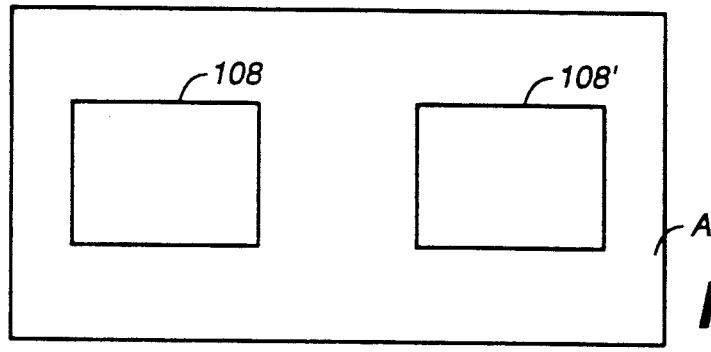
FIG._5A
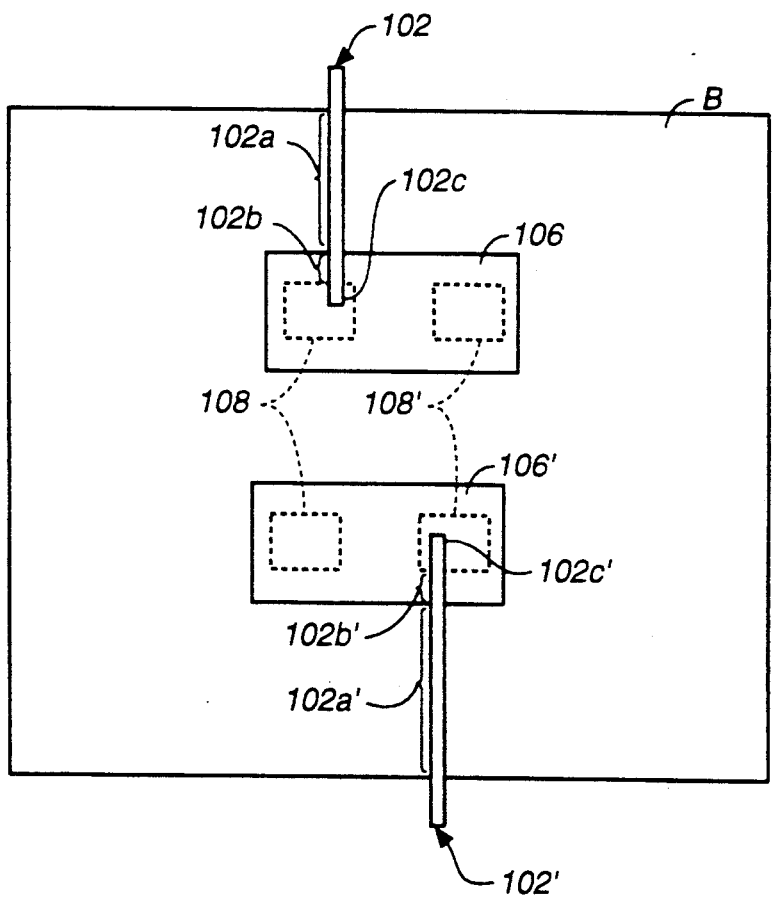
FIG._5B

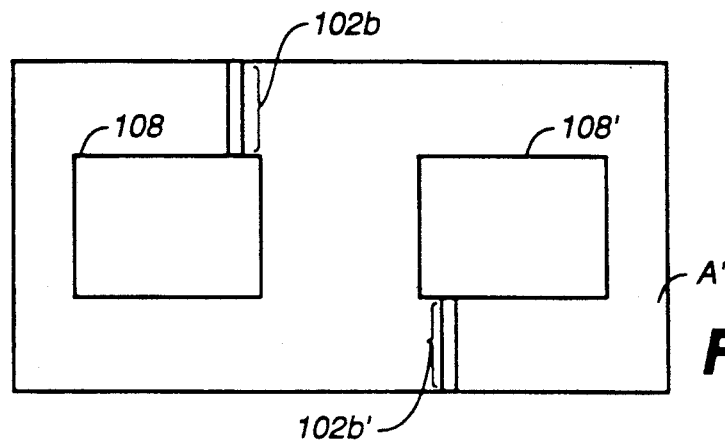
FIG._5C
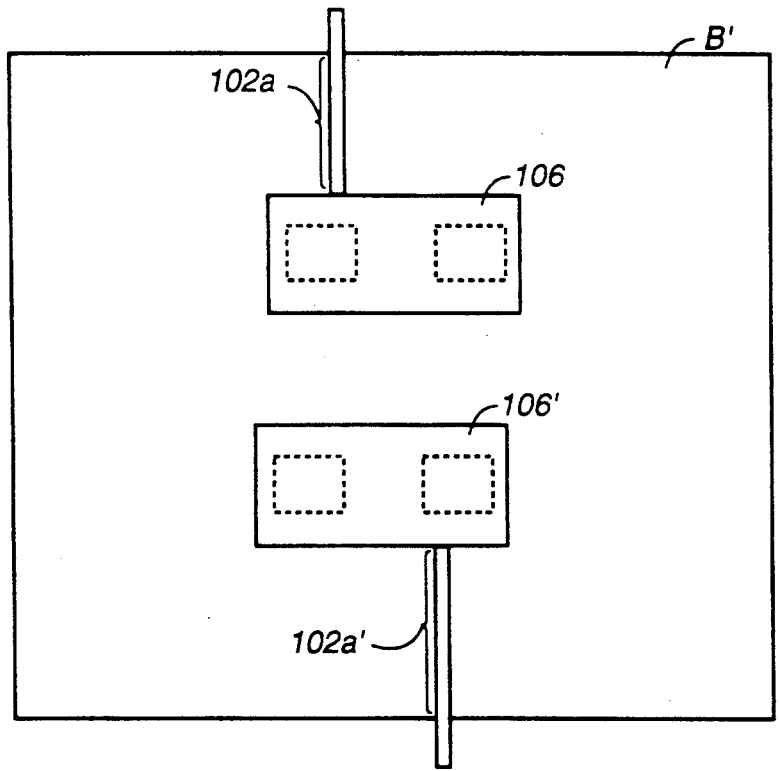
FIG._5D

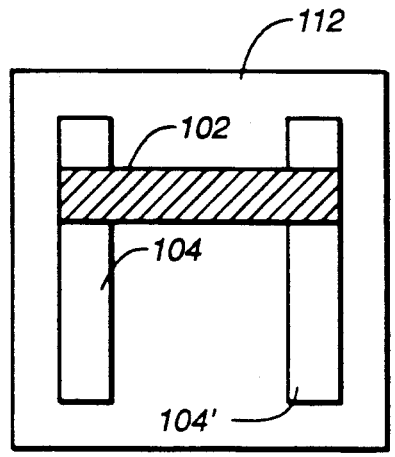
FIG._6A
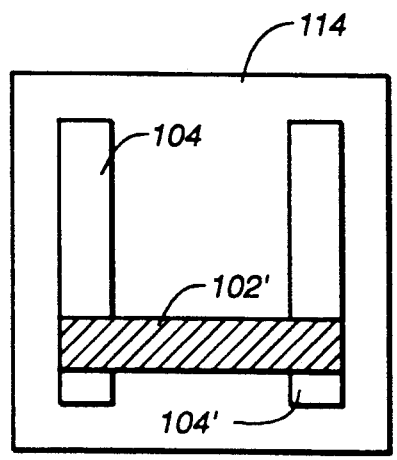
FIG._6B
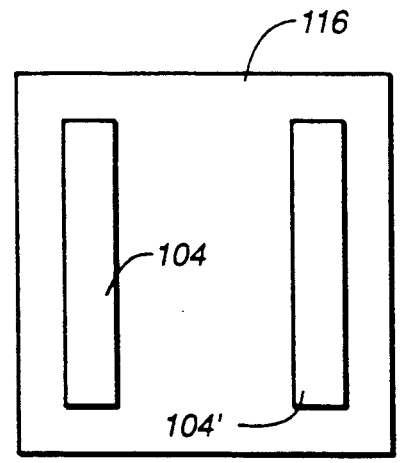
FIG._6C
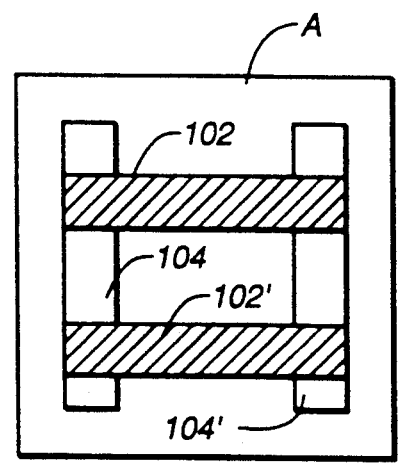
FIG._6D

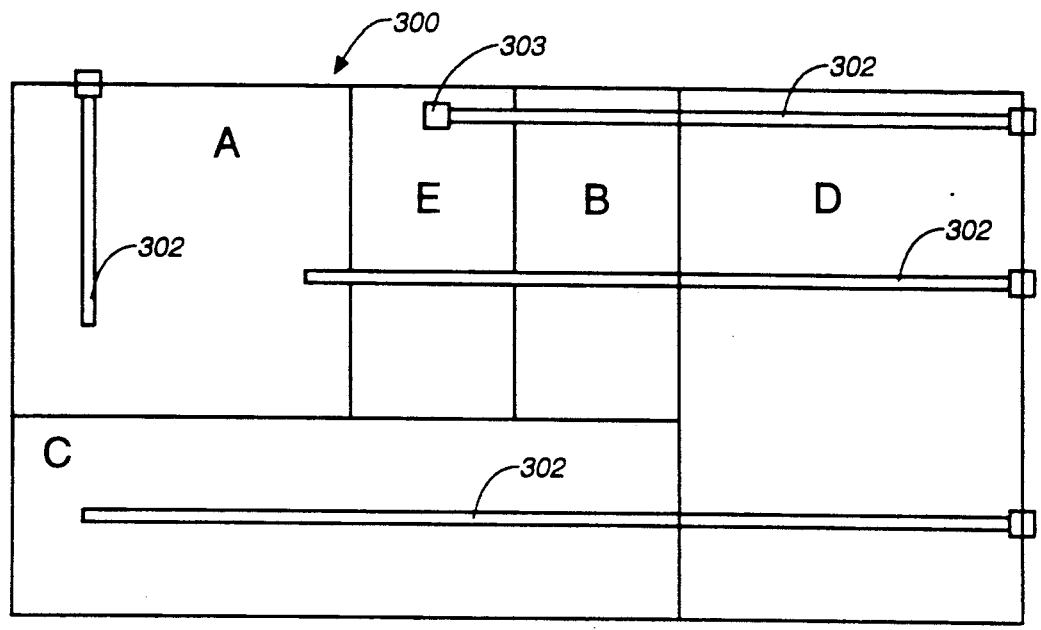
FIG._7
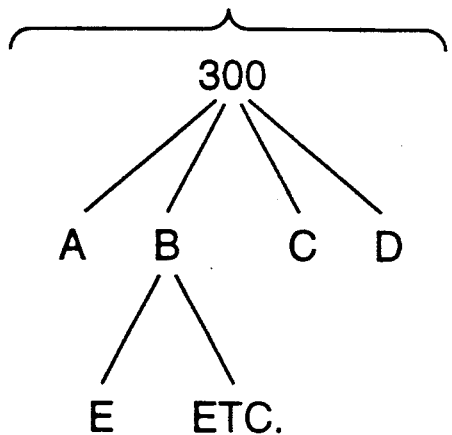
FIG._8A
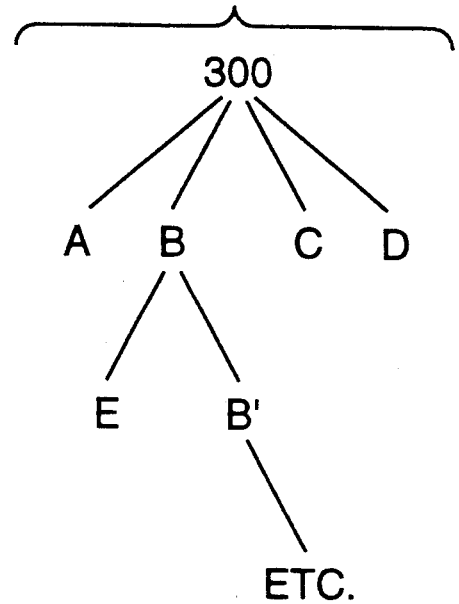
FIG._8B

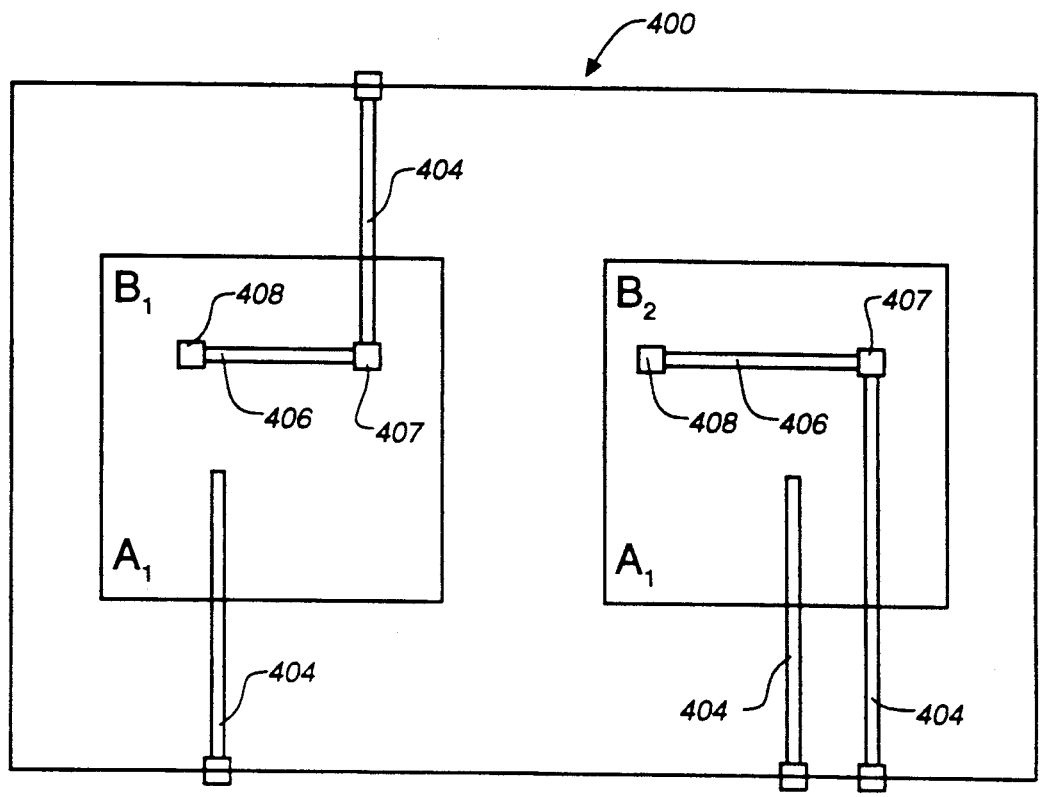
FIG._9A
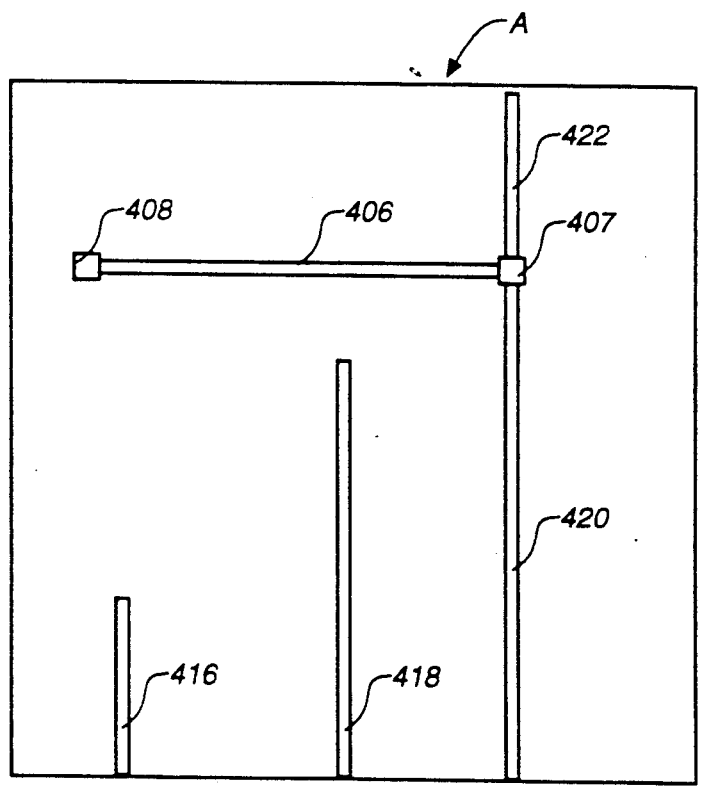
FIG._9B

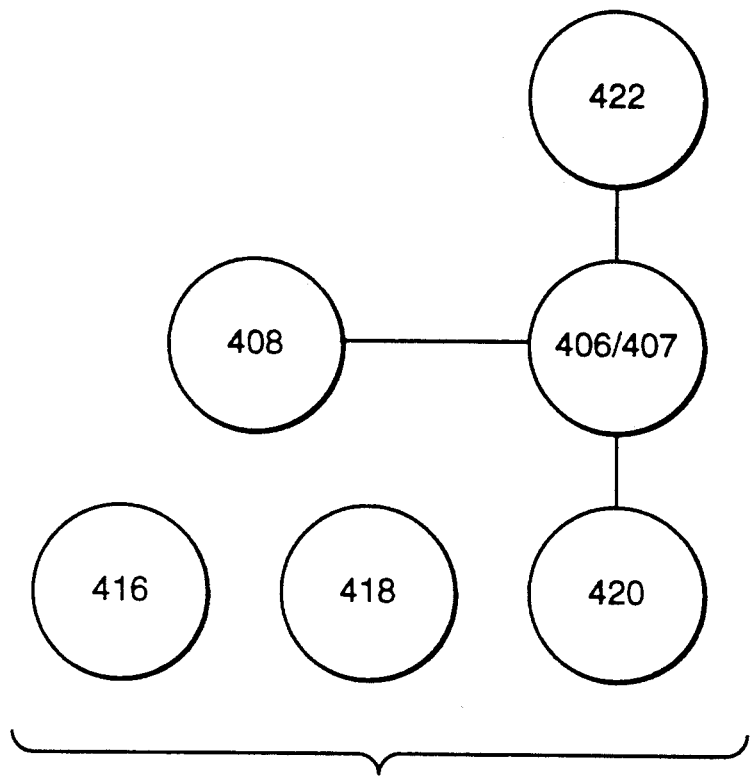
FIG._10A
FIG._10B
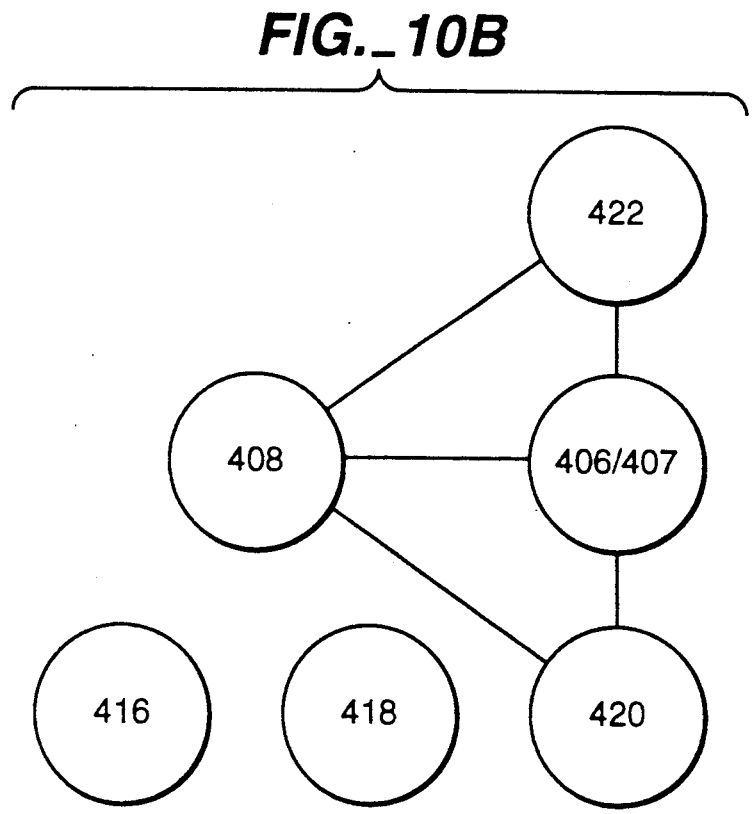

CLONING METHOD AND SYSTEM FOR HIERARCHICAL COMPACTION

BACKGROUND OF THE INVENTION

1. Field of the Invention

This invention relates generally to the field of automated design techniques for electronic circuits, and more specifically to compaction methods and systems for hierarchically defined layouts of integrated circuits.

2. Related Art

Layout compaction is the process of taking an existing layout and producing a new layout in which some geometrical aspect (usually size) is minimized. This process preserves the underlying circuit integrity and enforces design rule correctness. The constraints that need to be satisfied during compaction give rise to a system of linear inequalities. For the compaction of layouts devoid of hierarchy, this constraint system can be solved efficiently using graph based techniques. For compaction of multi-level hierarchies in which cell abutment is to be preserved, the system of constraints is more complex and must be solved using general linear programming (LP) techniques. Because of the computational complexity of LP, it is imperative to keep the number of variables and constraints to a minimum.

Objects within a cell that interact with objects in other cells are called ports. In order to reduce the number of variables and constraints that need to be solved by LP a port abstraction is used for each cell. This abstraction consists of the ports of the cell and the constraints between them induced by the internals of the cell. Only the variables representing the ports and the constraints between them need to be solved by LP. The number of ports is small compared to the total number of objects in the cell. The number of constraints between the ports is typically on the order of the number of ports. Therefore the size of the problem that needs to be solved by LP is considerably reduced.

Over-the-cell routing (OTCR) is a means by which cells can be personalized at higher levels of the hierarchy. Through its use, a same cell can be tailored to fit several different requirements. OTCR commonly is used in regular structures such as PLAs, data paths, etc. OTCR consists of primitive objects placed on top of instances and generally is used to connect objects in the interior of an instance to the outside, as well as to connect objects within an instance.

OTCR objects occurring over an instance interact with objects inside that instance. These objects must then become ports of the master cell of that instance. Hence, the variables representing their locations and the constraints between them need to be solved using linear programming. FIG. 1 shows a cell A containing ten contacts 100. An OTCR wire 102 over A is shown across cell A. Because this OTCR object 102 requires a design rule spacing to each of the contacts 100, all ten contacts must become ports of cell A.

In the absence of OTCR, all the ports are on the boundary of the cell. Hence, the number of ports relative to the number of objects in the cell is small. Also, this proportion decreases as the size of the cell increases. In the presence of OTCR this proportion can be large and does not always decrease as cell size increases. OTCR objects, such as buses that run over instances, can interact with a large number of objects in a cell, causing almost all the objects in the cell to become ports. Furthermore, a same cell can be instantiated with several different patterns of OTCR. All the objects in the cell that interact with any of these patterns anywhere in the hierarchy must become ports.

Most commonly occurring hierarchies contain some amount of OTCR. Any effective hierarchical compaction method must incorporate a strategy for handling OTCR without significantly degrading the performance. In the presence of OTCR, the compactor must preserve design rule correctness and circuit integrity across levels of the hierarchy whilst preserving input hierarchy and cell abutment.

True hierarchical compaction maintains the input layout hierarchy as well as the abutment constraints between cells. The bottleneck for hierarchical compaction is the time taken to analyze the system of equations which must be solved via linear programming methods. Because of the computational complexity of linear programming, it is essential to keep this system of equations as small as possible. In the presence of OTCR the amount of interaction between levels of hierarchy increases considerably. This causes a substantial rise in the number of constraints and hence the time taken by the compaction process is significantly increased.

Thus, there remains a need for an efficient compaction system and method for arbitrary hierarchies containing over-the-cell routing without significantly degrading the run time performance of the hierarchical compactor.

SUMMARY OF THE INVENTION

The present invention is a computer system and computer-implemented method for compacting the geometrical area of a hierarchical integrated circuit layout. Typically, these layouts include cells, instances, and objects. The present invention is particularly adapted for use with layouts containing over-the-cell routing (OTCR).

The inventive method includes the general steps of normalizing the cells, compacting the cells, then reconstructing the layout that includes the compacted normalized cells. More particularly, the step of normalizing the cells includes initial step of identifying an overlapping object produced from the OTCR that overlaps one of the instances. That overlapping object is then divided into an overlapping segment and a non-overlapping segment. The overlapping segment is then removed from the cell and copied into the cell of the overlapped instance. The overlapping segment is defined as a special object of the cell into which it is copied.

In practicing the inventive method, the steps are performed in a top-down manner through the hierarchical layout until each cell includes only objects and special objects, i.e., the cells do not contain any instances of other cells. The inventive method further includes generating a clone tag associated with the special object. The clone tag includes a list of instance identifications, such as instance locations, associated with the specific object. Clone tags may also be generated for objects other than special objects.

Once the clone tags are generated, a relationship between pairs of objects, both special and resident, may be defined. For example, if a first object includes an associated clone tag Tag1, and a second object includes an associated clone tag Tag2, the relationship may be any of the following: same clone tag; Tag1 is a subset of Tag2; Tag2 is a subset of Tag1; and, no relationship.

Based on these relationships, the inventive method further includes generating a relationship graph for each leaf cell. The relationship graph is then used to generate the correct design rule constraints for the subject cell. In this manner, hierarchical layouts using OTCR can be compacted in an efficient manner.

BRIEF DESCRIPTION OF FIGURES

The invention is further described in the attached claims and specification, including the figures in which:

FIG. 1 is a graphic representation of prior art over-the-cell routing;

FIG. 2 is a block diagram showing the cloning system of the present invention;

FIG. 3 is a flow chart representing the steps of a preferred embodiment of the inventive cloning method;

FIGS. 4A-4C are exemplary cells, having OTCR, to which the inventive cloning method is applied;

FIGS. 5A-5D are exemplary cells, having OTCR, to which the inventive cloning method is applied;

FIGS. 6A-6D are exemplary cells having instances crossed by OTCR wires, illustrating the effect of performing the inventive cloning method on the cells;

FIG. 7 is a graphical representation of a composite cell containing primitive shapes and instances;

FIG. 8A is a hierarchy tree prior to preforming the inventive cloning process;

FIG. 8B is the hierarchy tree of FIG. 8A illustrating the effect of the inventive cloning process;

FIG. 9A shows an exemplary three level hierarchy configuration;

FIG. 9B shows the contents of cell A after performing the inventive cloning method;

FIG. 10A shows a relationship graph of the invention after a scan line has been run; and FIG. 10B shows the final relationship graph of FIG. 10A.

DETAILED DESCRIPTION OF THE INVENTION

Even for modest amounts of OTCR the amount of additional variables and constraints that need to be solved by linear programming (LP), due to the increase in the number of ports, becomes large. In the inventive method, OTCR is treated as part of the cell it overlaps, thereby eliminating the need to make many of the objects within the cell into ports. Cloning shifts some of the computation needed to solve the hierarchal compaction problem away from LP and into the graph domain where it can be solved more efficiently.

The present inventive cloning process may be used to transform any input design hierarchy to a canonical or normalized form devoid of OTCR. Hierarchical compaction may be performed on this normalized hierarchy, which hierarchy is then transformed back to the compacted representation of the original design hierarchy.

Briefly, primitive objects at any level of the hierarchy that partially overlap a cell instance are cut up into sections that overlap the instance and sections that do not. The sections that overlap the instance are removed from that level of the hierarchy and copied, or cloned, into the master of the overlapped instance. This process is called cloning. The process is recursive in that the newly copied objects may now overlap with instances in the cell into which they were copied. Therefore, they may have to be cut up again and the sections overlapping instances will again need to be cloned into the masters of those instances. In a multi-layer hierarchy, cloning is preferably performed top-down through the hierarchy.

By moving OTCR objects inside the cell that it overlaps, the number of ports within the cell and hence the number of variables and constraints that need to be solved using LP is reduced. However, the objects introduced via cloning, i.e., cloned objects, cannot be treated akin to pre-existing objects, such as resident objects, in the cell. Failure to distinguish between these objects can result in layouts much larger than necessary, or worse, can cause design rule and circuit violations.

Generally, the cloned objects are treated specially during net extraction and constraint generation within a cell, since the presence of OTCR objects destroys the transitive nature of electrical connections between objects. Special data structures to establish and efficiently examine the relationships between the cloned and resident objects are also needed and are described in further detail below.

Referring now to FIG. 2, a block diagram of a cloning system embodying the present invention is shown. In a preferred embodiment, the invention is implemented on a general purpose computer such as a Sun Microsystems, Inc. workstation. Utilizing dedicated software, the general purpose computer specifically configures memory and system peripherals for the purpose of executing the preferred method. The illustrated system of FIG. 2 includes processor 71, display 73, keyboard 75, printer 77, program memory 88, and local area network 78. Processor 71 executes a set of instructions stored in program memory 88, while keyboard 75 and display 73 provide a user interface to processor 71. Printer 77 generates a permanent record of the output generated by the present invention, and local area network 78 enables processor 71 to communicate and exchange information with external computers and other external systems. Not shown in FIG. 2, but useful as an alternative embodiment, is a digitizing table for identifying and generating coordinates and integrated circuit (IC) layouts. Processor 71 is connected to various memories and storage devices through data bus 81. Connected to data bus 81 are clone tag register 83, relationship graph register 85, leaf cell constraint set 95, and Intracell constraint register 97.

Turning now to FIG. 3, that shows a flow chart of the steps of the inventive method. Generally, the inventive method involves a first step of normalizing the cells 201. The normalizing step 201 generally includes the substeps of identifying 202 OTCR objects that overlap cell instances in the host cell, dividing 203 each overlapping object into an overlapping segment and a non-overlapping segment, removing 204 the overlapping segment from the cell, and then copying 205 the overlapping segment into the cell of the overlapped instance. This copied overlapping segment is defined as a special object of the cell into which it is copied.

The normalizing step 201 of the invention is further illustrated in FIGS. 4A-4C. FIG. 4A shows a leaf cell A having two objects 104, 104' wherein all objects are assumed to be on the same hierarchical layer. Cell B, shown in FIG. 4B, includes two instances 106, 106' of cell A and some OTCR objects 102, 102'. As shown in FIG. 4B, in layouts using OTCR, wires 102, 102' in cell B cross through cell B and over instances 106, 106', respectively, of cell A. The portion of the wires 102, 102' that cross over instances 106, 106', respectively, of cell A are divided into overlapping segments 102b, 102b' and non-overlapping segments 102a, 102a' of the instances 106, 106' respectively. The overlapping segments 102b, 102b' are copied, or cloned, into the leaf cell A as special objects. FIG. 4C shows the modified leaf cell A' after cloning has been performed.

In another embodiment, as shown in FIGS. 5A–5C, cell A, which is not a leaf cell, contains instances 108, 108' of leaf cell C (not shown). FIG. 5B shows cell B containing instances 106, 106' of cell A. The OTCR wires 102, 102' overlap cell B (shown as reference numbers 102a, 102a'), the instances 106, 106' of cell A (shown as reference numbers 102b, 102b'), and the instances 108, 108' of cell C (shown as reference numbers 102c, 102c'). FIG. 5C shows the modified cell A', with OTCR wires 102b, 102b' overlapping cell A, but no longer overlapping instances 108, 108' of cell C. FIG. 5D shows the modified cell B', with OTCR wires 102a, 102a'. Note that the segment of the OTCR wire 102b, 102b' that had crossed the instance of cell A has gone into cell A, shown in FIG. 5C, and the segment of the OTCR wire 102c, 102c' that had crossed the instance of cell C has gone into cell C (not shown). Thus, the process may be performed for each level down in the hierarchy. The process is performed until cell A' contains only objects, including any cloned special objects.

In a preferred form of the invention, the OTCR objects 102b, 102b' in cell A' are mutually invisible during compaction because they are cloned through different instances (e.g., 108 and 108'). Therefore, there should be no design rule constraint separating these objects 102b, 102b'. Treating these objects 102b, 102b' as resident objects will produce a spacing constraint between them and therefore result in a layout which is larger than necessary.

FIGS. 6A–6D further illustrate this point. FIGS. 6A, 6B, and 6C show three instances 112, 114, 116, respectively, of the same leaf cell A. These instances are assumed to appear at different locations in the input hierarchy. The OTCR wires 102, 102', respectively, for each instance of A is shown, and all objects (104, 104', 102, 102') are assumed to be on the same mask layer. Note that instance 116 does not include an OTCR wire 102. FIG. 6D shows the contents of the corresponding cell A after cloning has been performed.

Objects 104 and 104' appear to be electrically connected to the same net because of cloned objects 102, 102'. However, in the configuration of instance 116 in FIG. 6C objects 104 and 104' are not electrically connected and therefore, a design rule spacing between them is required. If 102 and 102' are treated as resident objects, a design rule violation will occur because 104 and 104' will be connected to the same net and hence not have a design rule spacing between them.

In a preferred form of the present invention, the hierarchical compaction model includes four basic types of cells:

Point Cells, such as contacts and devices, that are considered to be immutable during compaction;

Leaf Cells that contain only primitive objects, such as wires and instances of point cells;

Pure Hierarchy Cells that contain only instances of other cells (except point cells); and Composite Cells that contain a mixture of primitive objects and instances of other cells.

In the normalized version of an input hierarchy all cells (except point cells) are either pure hierarchy or leaf cells. This process of transforming the composite cells to either pure hierarchy or leaf cells is referred to as normalization in the inventive method. Normalization is performed one cell at a time, in a top-down manner, starting from the root of the input hierarchy.

During normalization of a composite cell, a scan line engine is run across the cell. The scan line reports intersections between the extents of the primitive objects and cell instances. Certain primitive objects whose extents overlap with cell instances are cut up and the overlapping portions are cloned into the cell instance. This operation is recursive and proceeds till the object is finally cloned into an instance of a leaf cell. During this process all composite cells are converted to either pure hierarchy or leaf cells, as described in further detail below.

FIG. 7 shows an example of the normalization process of a preferred form of the present invention. In that example, the composite cell 300 contains some primitive shapes 303 and instances of cells A, B, C and D. Cells A, C and D are leaf cells, whereas cell B is a composite cell containing an instance of the leaf cell E and some primitive shapes 302. All the primitive shapes 302 in cell 300 are completely covered by the union of the extents of instances in cell 300. Hence, the shapes 302 are cut up and cloned into the instances they overlap. This operation converts cell 300 to a pure hierarchy cell. Cell B imports portions of two of the shapes 302 in cell 300. FIG. 8A shows a hierarchy tree prior to cloning.

During the subsequent normalization of cell B, sections of the primitive shapes 302 that overlap the instances in B are cut up and cloned into those instances. However, certain sections of the primitive shapes 302 do not overlap any of the instances in B. Hence, as shown in the hierarchy tree of FIG. 8B, a new leaf cell B' is created that contains all of the sections of the primitive shapes 302 in B which do not overlap any of the instances in B. Using this process, cell B is converted to a pure hierarchy cell containing instances of cells E and B'.

As mentioned above, objects in leaf cells created by cloning (cloned objects) must be differentiated from the pre-existing objects (resident objects) in the cell. Furthermore, cloned objects in the same leaf cell that have been cloned through different instances must be distinguished amongst themselves. Associated with each cloned object is a tag, called "clone tag". The clone tag contains information on the originating cell of the cloned object as well as a history of the intermediate cloning operations performed on that object. The tags are necessary and sufficient to:

1. Correctly perform net extraction on the leaf cell in the presence of cloned objects;

2. Correctly generate design rule constraints in the presence of cloned objects; and 3. After compaction, recreate the original hierarchy by transforming the cloned objects into the cell from which it originated.

Clone tags describe the sequence of cloning operations applied to a cloned object from the originating cell to a leaf cell. Clone tags essentially consist of a list of instance identifications associated with the object to which they are assigned. These instance identifications may include instance locations, and other information that uniquely identifies the subject object. Further, each element in the list describes one particular cloning operation applied to that object. Resident objects in the leaf cell are simply considered as having a clone tag represented by an empty list.

Clone tags provide all the information needed to distinguish between cloned and resident objects in the cell. At any intermediate level in the hierarchy, an object being cloned down the hierarchy receives a new tag which is a list built in terms of the existing tag list. In a preferred form of the invention, the new tag list is built by adding an element representing the current cloning operation. In a preferred form of the invention, the new tag is added at the beginning, or head, of the existing tag list.

For a given cloned object, each element in the tag list needs to uniquely identify the cloning step to which it corresponds. To accomplish this, it may suffice to identify the instance into which the object was cloned. Given a cloned object and the instance into which it was last cloned, it may be possible to undo the last cloning step and put the cloned object back into the cell from which it came. Knowledge of the instance not only allows us to undo the cloning step, but also uniquely identifies that particular cloning operation.

In a preferred embodiment, a VLSI design environment is used and every instance anywhere in the hierarchy has a unique identification (ID). Each element in the clone tag list is therefore the ID of the instance corresponding to that cloning operation.

FIG. 9A shows an exemplary three level hierarchy. The root cell 400 includes two instances, $B_1$ and $B_2$, of cell B and some primitive objects 404 which partially overlap instances $B_1$ and $B_2$. Cell B in turn includes an instance $A_1$ of cell A that occupies the entire area of cell B and some primitive objects 406, 407. Cell A is a leaf cell that contains a single contact 408.

FIG. 9B shows the contents of cell A after cloning has been performed on the entire hierarchy. Object 408 is a resident object (contact) of cell A which existed before cloning. Objects 406 and 407 originated from cell B and were cloned into cell A via instance $A_1$. Objects 416, 418, 420, and 422 originated from cell C and were cloned into cell A after first being cloned into cell B via instances $B_1$ and $B_2$. Table 1 shows the clone tags for the objects in cell A:

TABLE 1

| Clone Tags in Cell A | | | | | | |
|---|---|---|---|---|---|---|
| Object | 406 | 407 | 408 | 416 | 418 | 420 | 422 |
| Clone Tag | $A_1$ | $A_1$ | 0 | $A_1B_1$ | $A_1B_2$ | $A_1B_2$ | $A_1B_1$ |

In a preferred embodiment, four relationships between pairs of clone tags may exist: sameTag; tag1SubTag2; tag2SubTag1; and noRelation. These relationships are used during net extraction and design rule generation. For any given pair of clone tags (corresponding to objects within the same leaf cell) exactly one of the above-mentioned relations holds.

The relation "sameTag" holds true between equivalent tags, i.e., tags which have the same tag elements at the same location in the list. The relation "tag1SubTag2" (alternatively "tag2SubTag1") holds true if the relation sameTag does not hold true and tag2 (alternatively tag1) can be obtained by appending tag elements to the end of tag1 (alternatively tag2). The relation "noRelation" holds true whenever none of the relations "sameTag", "tag1SubTag2", and "tag2SubTag1" hold. Table 2 shows some of the relationships between the tags in Table 1.

TABLE 2

| | Clone Tag Relationships | | | |
|---|---|---|---|---|
| tag2 ↓ tag1 → | $A_1B_1$ | $A_1B_2$ | $A_1$ | Θ |
| $A_1$ | tag2Sub-Tag1 | tag2SubTag1 | sameTag | tag1SubTag2 |
| $A_1B_1$ | sameTag | noRelation | tag1SubTag2 | tag1SubTag2 |

In a preferred form of the present hierarchical compactor method, the set of linear inequality constraints that describe the compaction problem are divided into three distinct classes: Intracell; Intercell; and Loop. Clone tags help create the correct Intracell constraints in the presence of cloned objects and avoid spurious designs and design rule violations.

For every master cell in the normalized hierarchy a set of Intracell constraints is generated. These are constraints between the ports of the master cell induced by constraints within the cell. The Intracell constraints are derived from the constraint sets of the leaf cells by transitive closure. These constraints are necessary and sufficient to preserve the integrity of the leaf cell during the hierarchical compaction process. Hence it is important that the leaf cell constraint sets not only include the correct constraints but are also devoid of any unnecessary constraints that could cause the compacted layout to be larger than necessary.

In the absence of cloned objects, constraint sets for leaf cells can be generated using any one of the techniques available to those skilled in the relevant art. However, in the presence of cloned objects, these aforementioned methods will not work because they might generate either a design rule incorrect or a larger than necessary, and hence an overconstrained layout. Using the present inventive method the clone tag data structure is used to create the correct constraints for each of the leaf cells.

In the absence of cloned objects, the transitive relationship between net connections hold true. Hence, if x is connected to y and y is connected to z, then x is also connected to z. Therefore net extraction is the simple process of merging nets based on physical connections. However, as discussed above, this is not true in the presence of cloned objects. Hence, during net extraction of a leaf cell, a graph that captures the various relationships between the nets of the cloned and resident objects is built. This graph is called the relationship graph. FIGS. 10A and 10B show representative relationship graphs, described in further detail below. The numbers correspond to numbers from FIGS. 9A and 9B.

Next, during creation of the constraint graph, the relationship graph is queried to find the appropriate constraint values. An exemplary outline of an algorithm that may be used to create the relationship graph is shown in the following Table 3:

TABLE 3

Outline of Algorithm for Relationship Graph

Initialize each object to a separate node in the graph
For each scan line intersection between a pair of objects
   cloneTagRelation = the relation between the clone tags
   switch (cloneTagRelation)
      case sameTag:

TABLE 3-continued

Outline of Algorithm for Relationship Graph

Merge the corresponding nodes in the graph
    Merge the nets
    break
  case tag1SubTag2:
  case tag2SubTag1:
    Create an edge between the corresponding
    nodes
  case noRelation:
    Do Nothing
Starting from each node that has a non null clone tag
  Perform depth first traversal and update graph Initially, every object belongs to a separate net and represents a single node in the relationship graph. During net extraction, a scan line is run across the cell from the left to the right. The scan line reports intersections between pairs of objects which appear to be physically connected. If they happen to have identical clone tags (sameTag), the nets corresponding to the objects, and their corresponding nodes in the relationship graph are merged. If the clone tag of one of the objects has the relation tag1SubTag2 (or tag2SubTag1) with the clone tag of the other, an edge is created in the relationship graph between the two nodes that correspond to these objects. If there is no relationship between the two clone tags (noRelation), no operation is performed on the relationship graph.

After the scan line has reported all the intersections a series of depth first traversals on the relationship graph is performed. Starting from each node in the graph that has non null clone tag, all other nodes that are reachable from the starting node and satisfy both of the following properties are identified:

The nodes that are reachable and have a clone tag (tag1) that either has the relation sameTag or the relation tag1SubTag2 with the clone tag of the starting node (tag2); and The path to the above nodes goes through nodes that have a clone tag (tag1) that either has the relation sameTag or the relation tag1SubTag2 with the clone tag of the starting node (tag2).

Each such identified node that has the same clone tag (sameTag) as the starting node is merged with the starting node. For each node whose clone tag has the relation tag1SubTag2 with the clone tag of the starting node, an edge is created between it and the starting node in the relationship graph, as shown in FIG. 10B.

Conceptually, each node that meets the above two criteria is connected to the starting node by a path of objects that are at least as resident as the starting node. These objects appear in all contexts in which the objects of the starting node appear. Hence, at the end of this process all objects that are electrically connected will correspond to either the same node or nodes that have an edge between them in the relationship graph.

Turning again to FIG. 9B, when the scan line reaches the intersection at 408, an edge is created between the nodes corresponding to 408 and 406 in the relationship graph. This is because 408 (tag1) is a resident object which has a null clone tag (empty tag list) and hence has the relation tag1SubTag2 with the clone tag of 406 (tag2). When the scan line reaches the intersection at 407 it reports four intersections. For the intersection between 406 and 407, the nodes corresponding to these objects and their nets are merged. This is because the objects 406 and 407 have clone tags that have the relation sameTag between them.

For the intersection between 407 and 422 and the intersection between 407 and 420, edges are created between the corresponding nodes in the relationship graph, because the clone tag of 407 has the relation tag1SubTag2 with the clone tags of 420 and 422. However, the clone tags of 420 and 422 are unrelated (noRelation) and hence no operation is performed on the relationship graph for this intersection.

The relationship graph after the scan line has been run is shown in FIG. 10A. Next during the depth first traversal from 422, an edge is added between 422 and 408. This is because the clone tag of 408 has the relation tag1SubTag2 with the clone tag of 422 and the path from 422 to 408 goes through the node 407 whose clone tag also has the relation tag1SubTag2 with the clone tag of 422. Similarly, during the traversal from 420 an edge is added between 420 and 408. The final relationship graph is shown in FIG. 10B.

During the generation of constraints, the clone tags are examined to determine if a design rule constraint may be needed between two objects. Objects on the same layer that are electrically connected together do not require a design rule constraint. The relationship graph is queried to determine whether the objects are electrically connected.

If one of the two objects has a clone tag that has the relation noRelation with the clone tag of the other object, a constraint between these objects is not needed. These objects are mutually invisible because they appear in entirely different contexts in the global hierarchy. If the clone tag of one of the objects has the relation tag1SubTag2 or tag2SubTag1 with the clone tag of the other object, then one of them appears in all contexts in which the other appears. Therefore a design rule constraint between them may be needed if they are not electrically connected. The relationship graph is examined to determine whether they are electrically connected. Only if the two corresponding nodes in this graph are connected by an edge will they be considered to be electrically connected. If the two objects have identical clone tags (sameTag) they appear in exactly the same context in the global hierarchy. Therefore a design rule constraint between them may be needed. Such objects are electrically connected if they correspond to the same node in the relationship graph.

Hierarchical compaction is performed on the normalized hierarchy consisting of leaf cells and pure hierarchy cells as described above. After compaction it is necessary to recreate the compacted version of the original hierarchy from the compacted version of the normalized hierarchy. In the compacted normalized hierarchy, the leaf cells contain cloned objects which must be correctly put back into their originating cell. Clone tags are used to perform this operation. Each element in the clone tag is used to undo a cloning operation that was performed on the corresponding object. By undoing each of the cloning steps represented in the clone tag, each cloned object is put back in the correct location of the originating cell.

What is claimed is:

1. A computer-implemented method for compacting the geometrical area of a hierarchical integrated circuit layout, the layout including instances, cells, objects, and utilizing over-the-cell routing, the method comprising the sequential steps of:

A. normalizing the cells, including the normalizing substeps of:
 (a) identifying an overlapping object, produced from the over-the-cell routing, that overlaps one of the instances;
 (b) dividing the overlapping object into an overlapping segment that overlaps the instance and a non-overlapping segment that is outside of the instance;
 (c) removing the overlapping segment from the cell; and
 (d) copying the overlapping segment into the cell of the overlapped instance, the overlapping segment being defined as a special object of the cell;
B. compacting cells with special objects; and then
C. reconstructing the layout.

2. The method of claim 1 further comprising the step of generating a clone tag associated with the special object, the clone tag including a list of instance identifications associated with the special object.

3. The method of claim 2 further comprising the step of, after normalizing substep (d), defining a relationship between pairs of the objects.

4. The method of claim 3 wherein a first clone tag Tag1 is associated with a first object and a second clone tag Tag2 is associated with a second object, the first object and the second object defining tagged objects, and wherein the relationship defining step further comprises identifying one relationship from the group of relationships including same clone tag, Tag1 is a subset of Tag2, Tag2 is a subset of Tag1, and no relationship.

5. The method of claim 4 wherein the compacting step further comprises the steps of:
 performing net extraction using the tagged objects; and then
 creating a graph representative of the net extraction.

6. The method of claim 5 wherein the compacting step further comprises generating correct design rule constraints by querying the net extraction graph.

7. The method of claim 1 wherein the normalizing substeps (a) through (d) are performed top down through the hierarchical layout until each of the cells includes only objects and special objects.

8. The method of claim 7 further comprising the step of generating a clone tag associated with the special object, the clone tag including a list of instance identifications associated with the special object.

9. The method of claim 8 further comprising the step of, after normalizing substep (d), defining a relationship between pairs of the objects.

10. The method of claim 9 wherein a first clone tag Tag1 is associated with a first object and a second clone tag Tag2 is associated with a second object, the first object and the second object defining tagged objects, and wherein the relationship defining step further comprises identifying one relationship from the group of relationships including same clone tag, Tag1 is a subset of Tag2, Tag2 is a subset of Tag1, and no relationship.

11. The method of claim 10 wherein the compacting step further comprises the steps of:
 performing net extraction using the tagged objects; and then
 creating a graph representative of the net extraction.

12. The method of claim 11 wherein the compacting step further comprises generating correct design rule constraints by querying the net extraction graph.

* * * * *